United States Patent
Kawashima et al.

(10) Patent No.: US 6,773,572 B2
(45) Date of Patent: Aug. 10, 2004

(54) METHOD OF METAL LAYER FORMATION AND METAL FOIL-BASED LAYERED PRODUCT

(75) Inventors: Toshiyuki Kawashima, Ibaraki (JP); Nobuharu Tahara, Ibaraki (JP); Kenichi Ikeda, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 10/330,300

(22) Filed: Dec. 30, 2002

(65) Prior Publication Data

US 2003/0129440 A1 Jul. 10, 2003

(30) Foreign Application Priority Data

Jan. 10, 2002 (JP) .................................... P. 2002-003742

(51) Int. Cl.⁷ .................... C23C 28/02; C23C 14/00; B05D 1/18
(52) U.S. Cl. ............... 205/183; 205/186; 205/205; 204/192.1; 427/250; 427/404; 427/435
(58) Field of Search .................. 427/123, 124, 427/125, 250, 404, 405, 435, 436; 156/47, 51, 52, 233, DIG. 16; 204/192.1, 192.17; 205/183, 186, 205

(56) References Cited

U.S. PATENT DOCUMENTS

| | | | | |
|---|---|---|---|---|
| 4,882,232 A | * | 11/1989 | Bugnet et al. ............... | 428/613 |
| 4,985,297 A | * | 1/1991 | Tamaru et al. ............... | 428/260 |
| 5,252,383 A | * | 10/1993 | Fukutake et al. ............ | 428/209 |
| 6,351,039 B1 | * | 2/2002 | Jin et al. ..................... | 257/759 |
| 6,498,309 B2 | * | 12/2002 | Kuno .......................... | 174/268 |
| 2002/0034873 A1 | * | 3/2002 | Aoi .............................. | 438/627 |

FOREIGN PATENT DOCUMENTS

| | | |
|---|---|---|
| EP | 0 225 985 A1 | 6/1987 |
| EP | 0 281 312 A2 | 9/1988 |
| JP | 62279936 | 12/1987 |
| JP | 2000306568 | 11/2000 |
| JP | 2000319442 | 11/2000 |
| JP | 2001151929 | 6/2001 |

OTHER PUBLICATIONS

European Search Report dated Nov. 20, 2003.

* cited by examiner

*Primary Examiner*—Michael La Villa
(74) *Attorney, Agent, or Firm*—Sughrue Mion, PLLC

(57) ABSTRACT

A method of metal layer formation which can satisfactorily eliminate the problems caused by plating solution infiltration and is sufficiently effective in reducing the permittivity of an insulating layer; and a metal foil-based layered product obtainable by the method. The method is for forming a metal layer on a surface of a porous resin layer and includes: a step in which a porous resin layer having a dense layer as a surface part thereof is used as the porous resin layer and a thin metal film is formed on the surface of the dense layer by a dry process; and a step in which a metal film is formed on the surface of the thin metal film by plating.

3 Claims, 1 Drawing Sheet

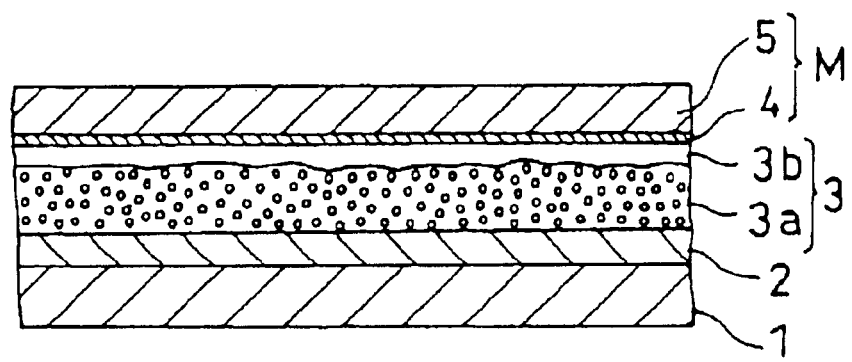

METHOD OF METAL LAYER FORMATION AND METAL FOIL-BASED LAYERED PRODUCT

FIELD OF THE INVENTION

The present invention relates to a method of metal layer formation for forming a metal layer on a surface of a porous resin layer and to a metal foil-based layered product which can be obtained by the method. The invention is useful especially for forming an insulating layer or wiring layer for wiring boards for high-frequency use.

BACKGROUND OF THE INVENTION

With the recent trend toward higher information processing rates and higher communication wave frequencies in information/communication appliances, the wiring boards on which electronic and other parts are to be mounted are also required to have suitability for high frequencies. For example, the insulating layers in such wiring boards are required to have a low permittivity and a low dielectric dissipation factor at high frequencies so as to attain excellent high-frequency transmission characteristics and excellent low-crosstalk characteristics.

The reasons for that are as follows. In the circuit of a wiring board, an energy loss in transmission, which is called a transmission loss, occurs. This transmission loss is proportional to the product of the frequency f of the signal, the ½ power of the dielectric constant $\in$, and the dielectric dissipation factor tan $\delta$ of the material. Because of this, materials to be used in wiring boards for higher frequencies f are especially required to have a low dielectric constant $\in$ and a low dielectric dissipation factor tan $\delta$. Furthermore, materials having a low dielectric constant $\in$ are desired for high-frequency applications also from the standpoint that the rate of signal transmission is inversely proportional to the ½ power of dielectric constant $\in$.

In the method which has been generally employed for forming such an insulating layer having a low permittivity and a low dielectric dissipation factor, a resin material which itself has a low permittivity is used. Known examples of such low-permittivity resin materials include fluoropolymers such as polytetrafluoroethylene and polyimide resins.

On the other hand, there is a technique for forming an insulating layer having a lower permittivity than the resin material itself constituting the layer. This technique comprises forming the insulating layer so as to have a porous structure. For example, JP-A-62-279936 proposes a process for producing a metal foil-based layered product for high-frequency use which comprises forming a porous precursor layer on a metal foil by a wet film-forming method using a solution containing a poly(amic acid) and then imidizing the polymer to thereby form a porous polyimide layer. This metal foil is processed mainly by wet etching in a later step to form a circuit pattern. Thus, the metal foil is used as a wiring layer. In order for such a metal foil-based layered product to be used as a double-sided wiring board, it has been necessary that a metal layer should be formed, prior to the etching step, on the layered product on the side opposite to the metal foil by laminating another metal foil to that side or forming a metal layer on that side by plating.

However, it was found that when the metal foil-based layered product described above is subjected to electroless plating using a plating solution so as to form an undercoat for a metal layer on the surface of the porous layer, then the plating solution infiltrates into pores of the porous layer. This plating solution infiltration not only makes it difficult to obtain a satisfactory undercoat but also results in difficulties in removing the plating solution which has infiltrated. In addition, there is the possibility of posing problems such as wiring pattern short-circuiting.

JP-A-2000-319442 proposes a process for producing a metal foil-based layered product which comprises forming a porous polyimide layer on a substrate other than metal foils in the same manner as described above and then superposing a metal layer on one or each side of the resultant coated substrate through a heat-resistant adhesive layer. The examples of this heat-resistant adhesive which are specifically disclosed in that reference include films (20 $\mu$m thick) formed from thermosetting resins.

Although the method in which a metal layer is superposed through an adhesive layer is effective in avoiding the problems caused by plating solution infiltration, it has a problem that the insulating layer obtained has a permittivity increased by a value corresponding to the thickness of the adhesive layer. Furthermore, there are cases where the laminating crushes pores in the porous layer, resulting in increasing the density of the porous layer and thereby heightens the permittivity of the insulating layer.

SUMMARY OF THE INVENTION

One object of the invention is to provide a method of metal layer formation which can satisfactorily eliminate the problems caused by plating solution infiltration and is sufficiently effective in reducing the permittivity of an insulating layer.

Another object of the invention is to provide a metal foil-based layered product which can be obtained by the method.

The present inventors made intensive investigations on methods for forming a metal layer on a surface of a porous resin layer, in order to accomplish those aims. As a result, it has been found that those objects can be accomplished by using a porous resin layer having a dense layer as a surface part thereof and by forming a thin metal film beforehand on the surface of the dense layer by a dry process. The invention has been thus completed.

The invention provides a method of forming a metal layer on a surface of a porous resin layer which comprises: a step in which a porous resin layer having a dense layer as a surface part thereof is used as the porous resin layer and a thin metal film is formed on the surface of the dense layer by a dry process; and a step in which a metal film is formed on the surface of the thin metal film by plating. The term "dense layer" herein means a part which can be called a skin and has a lower porosity than the other part (the porosity ratio (porosity of the skin/that of the other part) is 0.25 or lower). Whether or not a porous resin layer has such a dense layer can be judged based on an examination of the surface or a section of the porous resin layer with an electron microscope.

In this method, the porous resin layer to be used is preferably one formed over a metal foil directly or through a resin film layer.

In forming the thin metal film, it is preferred that a thin metal film made of a metal or alloy comprising at least one member selected from the group consisting of chromium, titanium, platinum, palladium, and nickel be first deposited in a thickness of 5 nm or larger before forming the thin metal film by a dry process.

The invention further provides a metal foil-based layered product which comprises a metal foil, a porous resin layer formed over the metal foil directly or through a resin film layer, and a metal layer formed on the surface of the porous resin layer, wherein the porous resin layer has a dense layer as a surface part thereof and has a thin metal film formed on the surface of the dense layer by a dry process.

In this layered product, the thin metal film preferably comprises a layer made of a metal or alloy comprising at least one member selected from the group consisting of chromium, titanium, platinum, palladium, and nickel.

The method of metal layer formation of the invention has the following advantages. Since a porous resin layer having a dense layer as a surface part thereof is used, a thin metal film can be satisfactorily formed on the surface thereof by a dry process. This thin metal film has a barrier effect in plating, whereby the problems caused by plating solution infiltration can be satisfactorily eliminated. Since the dense layer is not nonporous although it is dense, the effect of reducing permittivity is higher as compared with the case where an adhesive or the like is interposed. Furthermore, neither the step of forming a thin metal film nor the step of forming a metal film especially necessitates pressing in the thickness direction. Consequently, this method is advantageous also from the standpoint of attaining a reduced permittivity by preventing compression.

In the case where the porous resin layer is one formed over a metal foil directly or through a resin film layer, a layered product having a metal layer on each side can be produced while satisfactorily preventing plating solution infiltration from occurring on the back side. Furthermore, the insulating layer of this layered product has a sufficiently reduced permittivity.

In the case where a thin metal film made of a metal or alloy comprising at least one member selected from the group of metals shown above is first deposited in a thickness of 5 nm or larger in the thin-metal-film formation described above, higher adhesion between the metal layer and the porous resin layer can be obtained as compared with the case where a thin copper film is directly formed by a dry process. Moreover, since this metal deposition is conducted in a thickness of 5 nm or larger, an undercoat layer suitable for diminishing the surface roughness of the dense layer can be formed.

On the other hand, the metal foil-based layered product of the invention has the following advantages. Since the porous resin layer has a dense layer as a surface part thereof and has a thin metal film formed on the surface of the dense layer by a dry process, the problems caused by plating solution infiltration can be satisfactorily eliminated as described above. In addition, the effect of reducing the permittivity of the insulating layer can be sufficiently obtained.

Furthermore, in the case where the thin metal film comprises a layer made of a metal or alloy comprising at least one member selected from the group of metals shown above, higher adhesion between the metal layer and the porous resin layer can be obtained as compared with the case where a thin copper film is directly formed by a dry process.

BRIEF DESCRIPTION OF THE DRAWING

The foregoing and other aims and advantages of the invention will be apparent from the following detailed description and the accompanying drawing, in which:

the FIGURE is a sectional view of one embodiment of the metal foil-based layered product obtained by the method of metal layer formation according to the invention.

DETAILED DESCRIPTION OF THE INVENTION

Modes for carrying out the invention will be explained below by reference to the drawing.

In the method of metal layer formation of the invention, a metal layer M is formed on a surface of a porous resin layer 3. An embodiment of this method is explained which uses a porous polyimide resin layer 3 formed on a metal foil 1 through a polyimide resin film layer 2, as illustrated in FIG. 1. First, a method for forming a porous resin layer 3 on a metal foil 1 through a resin film layer 2 is explained.

In this method, an undercoat film layer comprising, for example, a poly(amic acid) which has been imidized at least partly is first formed on a metal foil 1. This step may be conducted by separately forming an undercoat film layer on another coating substrate or the like and laminating (transferring) this film layer to a metal foil. It is, however, preferred to apply a solution containing a poly(amic acid) to a metal foil and then subjecting the resultant coating to drying and imidization to thereby form an undercoat film layer which has been imidized at least partly.

The metal foil 1 that can be used is any of various foils made of copper, cupro-nickel, bronze, brass, aluminum, nickel, iron, stainless steel, gold, silver, platinum, and the like. The thickness of the metal foil 1 is preferably from 1 to 50 $\mu$m. In the invention, it is especially preferred to use a copper foil, which is suitable for forming the wiring patterns of wiring boards. The surface of the metal foil 1 may be subjected to various, physical or chemical surface treatments, such as a surface-roughening treatment and a blackening treatment, for the purpose of enhancing adhesion to the resin film layer 2.

The application of a poly(amic acid) in a solution state has an advantage that poly(amic acid)s are less limited in molecular structure than polyimides due to their high solubility. Because of this, the following compounds can be used as the acid ingredient and amine ingredient for constituting the poly(amic acid). For thermal imidization, acid ingredients in the form of a carboxylic acid may be used.

Examples of the acid ingredient include tetracarboxylic dianhydrides such as pyromellitic dianhydride, 3,3',4,4'-benzophenonetetracarboxylic dianhydride, 3,3',4,4'-biphenyltetracarboxylic dianhydride, 2,3,3',4-biphenyltetracarboxylic dianhydride, 2,3,6,7-naphthalenetetracarboxylic dianhydride, 1,2,5,6-naphthalenetetracarboxylic dianhydride, 1,4,5,8-naphthalenetetracarboxylic dianhydride, 2,2'-bis(3,4-dicarboxyphenyl)propane dianhydride, bis(3,4-dicarboxyphenyl) sulfone dianhydride, perylene-3,4,9,10-tetracarboxylic dianhydride, bis(3,4-dicarboxyphenyl) ether dianhydride, ethylenetetracarboxylic dianhydride, and butanetetracarboxylic dianhydride.

On the other hand, examples of the diamine ingredient include 4,4'-diaminodiphenyl ether (DDE), 4,4'-diaminodiphenylmethane, 3,3'-diaminodiphenylmethane, 3,3'-dichlorobenzidine, 4,4'-diaminodiphenyl sulfide, 3,3'-diaminodiphenyl sulfone, 1,5-diaminonaphthalene, m-phenylenediamine, p-phenylenediamine (PDA), 3,3'-dimethyl-4,4'-biphenyldiamine, benzidine, 3,3'-dimethylbenzidine, 3,3'-dimethoxybenzidine, 4,4'-diaminodiphenyl sulfone, 4,4'-diaminodiphenyl sulfide, 4,4'-diaminodiphenylpropane, 2,4-bis($\beta$-amino-t-butyl)toluene, bis(p-$\beta$-amino-t-butylphenyl) ether, bis(p-$\beta$-methyl-$\delta$-aminophenyl)benzene, bis-p-(1,1-dimethyl-5-aminopentyl) benzene, 1-isopropyl-2,4-m-phenylenediamine, m-xylylenediamine, p-xylylenediamine, di(p-aminocyclohexyl)methane, hexamethylenediamine, heptamethylenediamine, octamethylenediamine, nonamethylenediamine, decamethylenediamine, diaminopropyltetramethylene, 3-methylheptamethylenediamine, 4,4-dimethylheptamethylenediamine, 2,11-diaminododecane, 1,2-bis-3-aminopropoxyethane, 2,2-dimethylpropylenediamine, 3-methoxyhexamethylenediamine, 2,5-dimethylhexamethylenediamine, 2,5-dimethylheptamethylenediamaine, 2,5-dimethylheptamethylenediamine, 3-methylheptamethylenediamine, 5-methylnonamethylenediamine, 2,11-diaminododecane, 2,17-diaminoeicosadecane, 1,4-diaminocyclohexane, 1,10-diamino-1,10-dimethyldecane, 1,12-diaminooctadecane, 2,2-bis[4-(4-aminophenoxy)phenyl]propane, piperazine, $H_2N(CH_2)_3O(CH_2)_2O(CH_2)NH_2$, $H_2N(CH_2)_3S(CH_2)_3NH_2$, and $H_2N(CH_2)_3N(CH_3)_2(CH_2)_3NH_2$.

A poly(amic acid) obtained beforehand by polymerizing the acid ingredient and the amine ingredient may be dissolved in a solvent to prepare a film-forming solution. Alternatively, a solution obtained by solution-polymerizing the two ingredients may be used as a film-forming solution after additives are added thereto. This solution polymerization is preferably conducted while keeping the water content in the system on the lowest possible level.

The poly(amic acid) is not particularly limited as long as it consists mainly of repeating units made up of a residue of an acid ingredient, such as those enumerated above, and a residue of an amine ingredient, such as those enumerated above, bonded to each other through an amide linkage. The poly(amic acid) may be one containing units derived from one or more other comonomers or containing a blending ingredient. The poly(amic acid) in the film-forming solution may have been partly imidized in such a degree that this imidization does not impair the solubility of the polymer. From the standpoint of imparting heat resistance, a low coefficient of linear thermal expansion, and a low coefficient of moisture absorption to the polyimide to be obtained, preferred poly(amic acid)s are ones having aromatic groups in the skeleton. Examples thereof include poly(amic acid)s comprising a product of the polymerization of an aromatic tetracarboxylic acid ingredient with an aromatic diamine ingredient, among the monomer ingredients enumerated above.

Poly(amic acid)s obtained from BPDA (biphenyltetracarboxylic dianhydride), DDE (diaminodiphenyl ether), and PPD (p-phenylenediamine) are preferably used from the standpoints of the solubility thereof and the heat resistance, coefficient of linear thermal expansion, and other properties of the polyimide to be obtained therefrom. In these poly(amic acid)s, the PPD/DDE molar ratio is preferably from 50/50 to 99/1, more preferably from 70/30 to 95/5.

Solvents for the poly(amic acid) are not particularly limited as long as the polymer is soluble therein. However, aprotic polar solvents such as N-methyl-2-pyrrolidone, N,N-dimethylacetamide, N,N-dimethylformamide, and dimethyl sulfoxide are preferred from the standpoints of solubility and the rate of solvent displacement by a coagulating solvent. Preferred examples thereof include N-methyl-2-pyrrolidone. A solvent such as diethylene glycol dimethyl ether, diethylene glycol diethyl ether, diethylene glycol dibutyl ether, triethylene glycol diethyl ether, 1,2-dimethoxyethane, 1,2-diethoxyethane, or 1,2-dibutoxyethane may be mixed with the solvent for the poly(amic acid) to thereby regulate the rate of solvent displacement.

For applying the solution containing a poly(amic acid) to the metal foil 1, any of various coaters such as a film applicator can be used. The poly(amic acid) concentration in the solution is preferably from 5 to 25% by weight, more preferably from 7 to 20% by weight, when the viscosity during application, ease of drying, etc. are taken into account.

The drying and imidization of the solution applied may be conducted simultaneously or successively. It is, however, preferred to first conduct drying at a temperature not higher than the boiling point of the solvent and then conduct imidization at a temperature of from 200 to 500° C., especially from 250 to 400° C. In case where imidization is conducted at too high a temperature, the polymer disadvantageously is completely or nearly completely imidized. Consequently, that temperature range is preferred from the standpoint of further enhancing the adhesive force between the resin film layer 2 and porous resin layer 3 to be obtained. The time period of imidization may be about from 10 to 300 minutes although it varies depending on the temperature. The drying may be conducted, for example, to such a degree that the coating becomes non-flowable.

By the method described above, an undercoat film layer comprising a poly(amic acid) which has been imidized at least partly can be formed on the metal foil 1. The thickness of the undercoat film layer formed is preferably from 0.1 to 15 μm, more preferably from 0.5 to 5 μm. Use of the metal foil 1 on which the resin film layer 2 has been formed beforehand prevents the porous resin layer 3 from being exposed when the metal foil 1 is processed by wet etching. Consequently, etchant infiltration into pores does not occur and the problems caused by a residual etchant can be avoided. Furthermore, when the thickness of the undercoat film layer is within the range shown above, the effect of reducing the permittivity of the whole insulating layer can be sufficiently maintained.

Subsequently, a porous precursor layer is formed on the undercoat film layer. For example, a wet film-forming method using a solution containing a poly(amic acid) may be used for forming a porous precursor layer on the undercoat film layer. The solution to be used may be the same as or different from the solution used for forming the undercoat film layer. Examples of the poly(amic acid) and solvent to be used include the same poly(amic acid)s and solvents enumerated above. In particular, it is preferred to use the same kind of poly(amic acid) so as to increase the adhesive force between the resin film layer 2 and porous resin layer 3 to be obtained.

When the decrease in molecular weight which can occur during a cleaning step, etc., is taken into account, the weight-average molecular weight, as determined by GPC, of the poly(amic acid) to be used for the wet film formation is preferably 8,000 or higher, more preferably 10,000 or higher. The upper limit of the weight-average molecular weight thereof is preferably 60,000 from the standpoints of preventing the film-forming solution from having impaired applicability due to a viscosity increase and of the polymer concentration of the varnish.

In the wet film-forming method, a porous layer 3 is generally obtained by dissolving the resin, additives, etc. in a solvent to prepare a film-forming solution (dope), applying (casting) this solution on a substrate (the undercoat film layer in the invention), immersing the coated substrate in a coagulating liquid to cause solvent displacement and thereby coagulate the resin (gelation), removing the solvent and other ingredients by rinsing in water, etc., and then removing the coagulating liquid and other ingredients by drying.

The dope in the invention is applied preferably at a temperature in the range of from −20 to 80° C. The coagulating liquid is not particularly limited as long as it is a liquid in which the poly(amic acid) used is insoluble and which is compatible with the solvent. Use may be made of water, an alcohol such as methanol, ethanol, or isopropyl alcohol, or a mixture of two or more thereof. Especially preferred is water. Although the temperature of the coagulating liquid is not particularly limited, it is preferably from 0 to 80° C.

The poly(amic acid) concentration of the film-forming solution is generally from 5 to 25% by weight. However, from the standpoint of forming a dense layer $3b$ as a surface part of the porous resin layer 3, the concentration thereof is preferably from 7 to 20% by weight, more preferably from 9 to 19% by weight.

In the invention, the dense layer $3b$ means that part of the porous resin layer 3 which has a lower porosity than the other part $3a$. The porosity of this dense layer $3b$ is preferably from 0 to 25%, more preferably from 0 to 10%. Too high porosities thereof tend to result in difficulties in forming a satisfactory thin metal film 4 on the surface of the dense layer $3b$. The porosity of the dense layer $3b$ can be determined by the method which will be described in the Examples.

The thickness of the dense layer $3b$ is preferably from 0.001 to 10 $\mu$m, more preferably from 0.05 to 5 $\mu$m, from the standpoints of satisfactorily forming a thin metal film 4 and obtaining the effect of sufficiently reducing the permittivity of the insulating layer. The surface of the dense layer $3b$ has an average pore diameter of preferably from 0 to 500 nm, more preferably from 0 to 100 nm.

An inorganic material such as lithium nitrate or an organic material such as polyvinylpyrrolidone may be added for the purpose of controlling pore shape or pore diameter. The concentration of such an additive in the solution is preferably from 1 to 10% by weight. The addition of lithium nitrate increases the rate of displacement of the solvent by a coagulating liquid, whereby a spongy structure having finger void structures (finger-shaped voids) formed therein can be formed. When an additive which reduces the rate of coagulation, such as polyvinylpyrrolidone, is added, a porous layer 3 of an even spongy structure can be obtained. It is preferred in the invention that the porous resin layer 3 should have a wholly spongy structure from the standpoint of diminishing the surface defects of the dense layer $3b$.

The thickness in which the film-forming solution is applied is not particularly limited. However, too large film thicknesses pose problems, for example, that solvent removal takes much time. In addition, insulating layers for recent multilayered wiring boards are desired to be thin and lightweight and have mechanical strength. Because of these, the thickness of the porous layer 3 constituting an insulating layer is desirably from 2 to 150 $\mu$m, preferably from 5 to 90 $\mu$m. In the invention, the proportion of the thickness of the resin film layer 2 to be obtained to that of the porous resin layer 3 to be obtained (resin film layer/porous resin layer) is preferably from 1 to 50%, more preferably from 5 to 10%, especially from the standpoint of enhancing the effect of reducing the permittivity of the whole insulating layer.

After rinsing in water, the resultant porous layer 3 is taken out and is then dried according to need. The temperature for this drying is not particularly limited as long as pores of the porous layer 3 do not close. However, drying at 200° C. or lower is desirable from the standpoint of handling. The imidization, which will be described below, may be conducted subsequently to or simultaneously with the drying.

Subsequently, at least the porous precursor layer may be imidized. In this imidization, both the undercoat film layer and the porous precursor layer may be imidized.

The imidization in the invention can be conducted under the same conditions as in imidization processes heretofore in use. For example, the imidization can be accomplished by holding the coated metal foil in a heating apparatus at a temperature of from 200 to 500° C. for from 1 to 3 hours. It is preferred to use a circulating hot nitrogen atmosphere from the standpoint of efficiently removing the water resulting from ring closure.

The porous layer 3 thus obtained preferably has an average pore diameter regarding pores present in a section thereof of from 0.02 to 10 $\mu$m. The porosity of the whole porous layer 3 is preferably from 30 to 80%.

The method of metal layer formation of the invention includes a step in which a thin metal film 4 is formed by a dry process on the surface of the dense layer $3b$ of the porous resin layer 3 described above. As the dry process can be used any of various vapor deposition techniques, ion plating, ion-beam vapor deposition, laser ablation vapor deposition, and various techniques of film deposition by sputtering. Especially preferred is film deposition by sputtering. Examples of the techniques of film deposition by sputtering include DC two-pole sputtering, high-frequency sputtering, magnetron sputtering, ion-beam sputtering, and reactive sputtering. Various conditions for the dry process can be suitably determined according to the thickness of the thin metal film to be formed while taking account of conditions heretofore in use.

For the reasons stated above, it is preferred in the invention that in forming a thin metal film 4, a thin metal film made of a metal or alloy comprising at least one member selected from the group consisting of chromium, titanium, platinum, palladium, and nickel should be first deposited. The thickness of this thin metal film is preferably 5 nm or larger, more preferably from 50 to 500 nm.

High-frequency sputtering is preferably used for depositing the metal or alloy because this film deposition technique is applicable to a wide range of materials. The high frequencies which are being mainly used for the sputtering include, for example, 13.56 MHz.

In forming a thin metal film 4, the formation of a thin metal film described above may be followed by the formation of a thin metal film by depositing a metal, e.g., copper, by a dry process. For this metal deposition also, the same dry processes as enumerated above can be employed. DC two-pole sputtering can be utilized for this step. Use of this technique is advantageous because of the simplicity of the apparatus structure and ease of the operation thereof.

The method of metal layer formation of the invention further includes a step in which a metal film 5 is formed on the surface of the thin metal film 4 by plating. Thus, a metal layer M comprising the thin metal film 4 and metal film 5 can be formed. This plating preferably is electroplating which is conducted while permitting a current to flow through the thin metal film 4. However, either a combination of such electroplating with electroless plating or electroless plating alone may be used for forming a metal film 5.

The material of the metal film 5 preferably is copper or a copper alloy, tin, nickel, gold, or the like. Copper is especially preferred. The thickness of the metal film 5 is preferably from 1 to 50 $\mu$m.

Electroplating can be conducted by a known method. In general, however, use is made of a method in which the layered product is immersed in a plating bath, and electrolysis reactions are conducted using the thin metal film 4 or another part as a cathode and a source of ions of the metal to be deposited as an anode to thereby deposit the metal on the cathode side.

Plating solutions for depositing various metals by electroless plating are known and various kinds are on the market. General electroless plating solutions have a composition containing a metal ion source, alkali source, reducing agent, chelating agent, stabilizer, etc.

The method of metal layer formation of the invention, which was described above, should not be construed as being limited to the case where the resin film layer 2 and the porous resin layer 3 each are made of a polyimide resin. At least either of the two layers may be made of a heat-resistant resin such as an aramid resin or a poly(phenylene ether) resin (PPE). In this case also, the problems caused by plating solution infiltration can be prevented and the effect of reducing the permittivity of the whole insulating layer can be sufficiently obtained.

In the embodiment described above, a porous resin layer 3 was formed on a metal foil 1 through a resin film layer 2. It is, however, possible to form a metal layer M on a porous resin layer 3 on which neither a metal foil 1 nor a resin film layer 2 has been superposed.

On the other hand, the metal foil-based layered product of the invention comprises, as shown in FIG. 1, a metal foil 1, a porous resin layer 3 formed over the metal foil 1 directly or through a resin film layer 2, and a metal layer M formed on the surface of the porous resin layer 3, wherein the porous resin layer 3 has a dense layer 3b as a surface part thereof and has a thin metal film 4 formed on the surface of the dense layer 3b by a dry process. Although this metal foil-based layered product can be advantageously produced by the method of metal layer formation of the invention, it may be one obtained by another process.

The metal foil-based layered product preferably has such a structure that the resin film layer 2 has not substantially penetrated into pores of the porous resin layer 3. In this case, it is preferred to select a combination of resins showing high adhesion to each other, for example, after wet film formation, because it is necessary to obtain a sufficient adhesive force between the two layers without the aid of an anchoring effect.

A wiring board can be produced from the metal foil-based layered product of the invention by forming a wiring pattern in the method foil 1 or metal layer M by a known etching technique or another technique. It is, however, noted that when the layered product is etched, a separate etching operation may be necessary for the thin metal film 4.

Examples for specifically illustrating the constitutions and advantages of the invention will be explained below together with Comparative Examples. The permittivity and porosity of each metal foil-based layered product were determined in the following manners.

(1) Dielectric Characteristics

The film layer-bearing porous layer from which the copper foil had been removed by etching was used as a sample to be examined. A resonator manufactured by Kanto Electronics Corp. was connected to a network analyzer manufactured by Agilent Technologies Inc. to determine the permittivity (strictly speaking, dielectric constant) at 10 GHz.

(2) Porosity of Whole Insulating Layer

The porosity of the film layer-bearing porous layer was calculated from the area S (cm$^2$), thickness t (cm), and weight m (g) thereof and from the density d (g/cm$^3$) of the material constituting the layer, using the following equation.

$$\text{Porosity}(\%)=(1-(m/d)/(S \times t)) \times 100$$

(3) Thickness and Porosity of Dense Layer

The pore volume of the dense layer was measured by the nitrogen adsorption method (BET method). The boundary between the dense layer and the other part was specified with a scanning electron microscope, and the thickness of the dense layer was measured. The apparent volume of the layer was calculated from the thickness and surface area thereof. The porosity of the dense layer was determined in terms of percentage (%) by dividing the pore volume by the apparent volume.

(4) Average Surface Pore Diameter of Dense Layer

A photograph of the surface of the dense layer was taken with a scanning electron microscope. The average surface pore diameter was determined through computer analysis of the photograph.

PRODUCTION EXAMPLE 1 OF COPPER FOIL-CLAD POROUS LAYER

A 15% by weight N-methyl-2-pyrrolidone (NMP) solution of a polyimide precursor obtained from BPDA (biphenyltetracarboxylic dianhydride), DDE (diaminodiphenyl ether), and PPD (p-phenylenediamine) (PPD/DDE molar ratio, 85/15) was used as a film-forming dope. This dope was applied in an even thickness to the blackened side of a 1-ounce rolled copper foil with a film applicator having a gap of 15 µm. Immediately thereafter, the coated copper foil was placed in a 100° C. drying oven for 15 minutes or more to dry the coating with air circulation. After the drying, the coating was heat-treated at 250° C. for 30 minutes in a nitrogen atmosphere to cause the polyimide precursor to undergo thermal ring closure.

After the coating had been cured and then cooled to ordinary temperature, a film-forming dope consisting of the same components as the dope used above and having a solid concentration of 19% by weight was applied in an even thickness to the dried polyimide precursor film with a film applicator having a gap of 65 µm. Immediately after the application, this coated copper foil was immersed in 25° C. pure water to coagulate the polyimide precursor and then dried at 90° C. for 1 hour or more. The coating thus dried was then heat-treated at 400° C. for 3 hours in a nitrogen atmosphere to cause the polyimide precursor to undergo thermal ring closure. Thus, a porous polyimide layer having a film layer was obtained.

This porous layer was an even spongy layer having a dense layer on the surface thereof. The thicknesses of the film layer and porous layer were 3 µm and 22 µm, respectively. The insulating layer had a porosity of 40% and a permittivity of about 2.4. The dense layer had a thickness of about 1 µm, porosity of about 5%, and average surface pore diameter of 20 nm.

PRODUCTION EXAMPLE 2 OF COPPER FOIL-CLAD POROUS LAYER

A polyimide precursor was applied to the blackened side of a copper foil and then caused to undergo thermal ring closure in the same manner as in Production Example 1. After the coating had been cured and then cooled to ordinary temperature, a film-forming dope consisting of the same components as the dope used above and having a solid concentration of 15% by weight was applied in an even thickness to the dried polyimide precursor film with a film applicator having a gap of about 90 µm. Immediately after the application, this coated copper foil was immersed in 25° C. pure water to coagulate the polyimide precursor and then dried at 90° C. for 1 hour or more. The coating thus dried was then heat-treated at 400° C. for 3 hours in a nitrogen atmosphere to cause the polyimide precursor to undergo thermal ring closure. Thus, a porous polyimide layer having a film layer was obtained.

This porous layer was an even spongy layer having a dense layer on the surface thereof. The thicknesses of the film layer and porous layer were 3 μm and 22 μm, respectively. The insulating layer had a porosity of 40% and a permittivity of about 2.4. The dense layer had a thickness of about 1 μm, porosity of about 25%, and average surface pore diameter of 30 nm, which was slightly larger than the pore diameter in Production Example 1.

PRODUCTION EXAMPLE 3 OF COPPER FOIL-CLAD POROUS LAYER

A polyimide precursor was applied to the blackened side of a copper foil and then caused to undergo thermal ring closure in the same manner as in Production Example 1. After the coating had been cured and then cooled to ordinary temperature, a film-forming dope consisting of the same components as the dope used above and having a solid concentration of 19% by weight was applied in an even thickness to the dried polyimide precursor film with a film applicator having a gap of 50 μm. After the application, this coated copper foil was allowed to absorb moisture under the conditions of a relative humidity of 100% and a temperature of 40° C. Thereafter, the coated copper foil was immersed in 25° C. pure water to coagulate the polyimide precursor and then dried at 90° C. for 1 hour or more. The coating thus dried was then heat-treated at 400° C. for 3 hours in a nitrogen atmosphere to cause the polyimide precursor to undergo thermal ring closure. Thus, a porous polyimide layer having a film layer was obtained.

This porous layer was an even spongy layer having no dense layer on the surface thereof. The thicknesses of the film layer and porous layer were 3 μm and 22 μm, respectively. The insulating layer had a porosity of 50% and a permittivity of 2.2. The porous layer had an average surface pore diameter of 2 μm.

Ethanol Infiltration Test

The copper foil was removed by etching from each of the layered polyimide products obtained in Production Examples 1 to 3. Ethanol was dropped onto the thus-exposed surface of the layered polyimide product to examine the surface for infiltration. As a result, ethanol infiltration did not occur in all the layered products.

Example 1

The copper foil-clad porous layer obtained in Copper Foil-Clad Porous Layer Production Example 1 was subjected to film deposition on the surface thereof with a high-frequency sputtering film deposition apparatus under the high-frequency power supply conditions of 13.56 MHz and 400 W (2.2 W/cm$^2$) for 3 minutes to form a thin metal film made of chromium having a thickness of about 30 nm. Film deposition thereon was further conducted with a DC two-pole sputtering film deposition apparatus under the DC power supply conditions of 0.6 A for 7 minutes to form a thin metal film made of copper having a thickness of about 120 nm.

Subsequently, an acid copper sulfate plating solution was used to conduct electroplating at a current density of about 3 A/dm$^2$ and a plating temperature of 25° C. to form a metal film made of copper in a thickness of 18 μm. As a result, a metal film comprising copper could be formed without arousing any particular problem.

On the other hand, an acid copper sulfate plating solution was dropped onto the thin-metal-film side of the layered product just before the electroplating to examine the surface for infiltration. As a result, no plating solution infiltration was observed.

Example 2

Thin metal films were formed by high-frequency sputtering and DC two-pole sputtering in the same manner as in Example 1, except that the copper foil-clad porous layer obtained in Copper Foil-Clad Porous Layer Production Example 2 was used. Thereafter, electroplating was conducted in the same manner as in Example 1 to form a metal film made of copper. As a result, a metal film comprising copper could be formed without arousing any particular problem.

Furthermore, an acid copper sulfate plating solution was dropped onto the thin-metal-film side of the layered product just before the electroplating to examine the surface for infiltration. As a result, no plating solution infiltration was observed.

Comparative Example 1

Thin metal films were formed by high-frequency sputtering and DC two-pole sputtering in the same manner as in Example 1, except that the copper foil-clad porous layer obtained in Copper Foil-Clad Porous Layer Production Example 3 was used. Thereafter, electroplating was conducted so as to form a metal film made of copper. However, an even and smooth metal film was unable to be formed. Furthermore, an acid copper sulfate plating solution was dropped onto the thin-metal-film side of the layered product just before the electroplating to examine the surface for infiltration. As a result, plating solution infiltration was found to occur.

Comparative Examples 2 and 3

The surfaces of the copper foil-clad porous layers obtained in Copper Foil-Clad Porous Layer Production Examples 1 and 2 were subjected to electroless plating without the formation of thin metal films by sputtering. Thereafter, electroplating was attempted under the same conditions as in Example 1. However, since the electroless plating could not be satisfactorily conducted, only a readily peelable metal layer was formed. Furthermore, an acid copper sulfate plating solution was dropped onto each layered product just before the electroless plating to examine the surface for infiltration. As a result, plating solution infiltration was found to occur.

Comparative Example 4

A 45 μm-thick adhesive epoxy sheet (ABF-45SH, manufactured by Ajinomoto-Fine-Techno Co., Inc.) and a 1-ounce rolled copper foil were heat-laminated to the surface of the copper foil-clad porous layer obtained in Copper Foil-Clad Porous Layer Production Example 1, at a temperature of 90° C. and a pressure of 49 kPa. The resultant laminate was hot-pressed under the conditions of 180° C. and 6 MPa to obtain an each-side metal foil-clad layered product. The copper foils were removed from this each-side metal foil-clad layered product by etching, and the whole insulating layer was examined for dielectric characteristics in the same manner as for the copper foil-clad porous layers. As a result, the permittivity thereof was found to be 3.8, which was considerably higher than that in Production Example 1 (permittivity: 2.4).

It should further be apparent to those skilled in the art that various changes in form and detail of the invention as shown and described above may be made. It is intended that such changes be included within the spirit and scope of the claims appended hereto.

This application is based on Japanese Patent Application No. 2002-003742 filed Jan. 10, 2001, the disclosure of which is incorporated herein by reference in its entirety.

What is claimed is:

1. A method of forming a metal layer on a surface of a porous resin layer which comprises: a step in which a porous resin layer having a dense layer as a surface part thereof is used as the porous resin layer and a thin metal film is formed on the surface of the dense layer by a dry process; and a step in which a metal film is formed on the surface of the thin metal film by plating, wherein the dense layer comprises the same resin material as that of the porous resin layer, and the metal is in elemental form.

2. The method of forming a metal layer on a surface of a porous resin layer of claim 1, which further comprises the step of forming another thin metal film, made of a metal or alloy comprising at least one member selected from the group consisting of chromium, titanium, platinum, palladium, and nickel, to a thickness of 5 nm or larger, before forming the thin metal film by a dry process.

3. A method of forming a metal layer on a surface of a porous resin layer which comprises: a step in which a porous resin layer having a dense layer as a surface part thereof is used as the porous resin layer and a thin metal film is formed on the surface of the dense layer by a dry process; and a step in which a metal film is formed on the surface of the thin metal film by plating, wherein the porous resin layer is formed on a metal foil directly or through a resin film layer, the dense layer comprises the same resin material as that of the porous resin layer, and the metal is in elemental form.

* * * * *